United States Patent
Kato

(10) Patent No.: US 6,793,514 B2
(45) Date of Patent: Sep. 21, 2004

(54) IC SOCKET

(75) Inventor: Yuji Kato, Yokohama (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 0 days.

(21) Appl. No.: 10/621,374

(22) Filed: Jul. 18, 2003

(65) Prior Publication Data

US 2004/0018760 A1 Jan. 29, 2004

(30) Foreign Application Priority Data

Jul. 19, 2002 (JP) ........................................ 2002-211710

(51) Int. Cl.[7] .............................................. H01R 13/62
(52) U.S. Cl. ........................................ 439/331; 439/70
(58) Field of Search ........................... 439/331, 70, 71, 439/142

(56) References Cited

U.S. PATENT DOCUMENTS

| | | | | |
|---|---|---|---|---|
| 4,846,704 A | * | 7/1989 | Ikeya | ........................... 439/72 |
| 5,076,798 A | * | 12/1991 | Uratsuji | ..................... 439/269.1 |
| 5,368,497 A | * | 11/1994 | Nagumo | ...................... 439/266 |
| 5,395,260 A | * | 3/1995 | Hayakawa et al. | ......... 439/266 |
| 5,443,396 A | * | 8/1995 | Tokushige | ................... 439/266 |
| 6,146,173 A | * | 11/2000 | Yagi | ............................ 439/266 |
| 6,350,137 B1 | * | 2/2002 | Shimada | ..................... 439/266 |
| 6,533,595 B2 | * | 3/2003 | Yamada | ....................... 439/266 |

* cited by examiner

Primary Examiner—Tulsidas C Patel
(74) Attorney, Agent, or Firm—Finnegan, Henderson, Farabow, Garrett & Dunner, LLP

(57) ABSTRACT

An IC socket of the present invention is to strengthen a cover member by coupling a lower surface or a lateral surface of a partition wall of the cover member to a rib to prevent the partition wall from breaking and improve the accuracy. The IC socket of the present invention has a socket body on which an IC package is mounted, a plurality of contacts provided in the socket body, and a cover member of a frame shape having an opening at a center thereof and movable upward and downward, wherein a rib is provided to be coupled to a lower surface or a lateral surface of the partition wall for sectioning a cam surface of the cover member operating the movable contact section.

9 Claims, 8 Drawing Sheets

IC SOCKET

This application claims priority from Japanese Patent Application No. 2002-211710 filed Jul. 19, 2002, which is incorporated herein by reference.

BACKGROUND OF THE INVENTION

1. Field of the Invention

The present invention relates to an IC socket in which an IC package is mounted to a socket body having a contact of a one-point touch structure type or a two-point touch structure type, more particularly to an IC socket provided with a cover member having ribs for coupling a partitioning wall for a contact to be attached to a socket body.

2. Description of the Related Art

In an IC socket on which an IC package or the like is mounted as an electric part, that has been known in the prior art, in which contacts of the socket body and external contacts of an IC package mounted to such a socket body are capable to open and close to each other.

An example of a cover member for such a prior art IC socket is illustrated in FIG. 8. In this FIG. 8, there is shown only a cover member. This IC socket includes a socket body (not shown) having contacts of a one-point touch type or a two-point touch type and a cover member 105 adapted to be movable upward and downward relative to the socket body, wherein the cover member 105 has ribs 108 for coupling partition walls 109 for the contacts attached to the socket body.

However, in the conventional IC socket of such a type, the partition wall 109 is weak in structure, because a space 110 exists between the partition wall 109 on a cam surface 107 of the cover member 105 for operating a movable contact section of the contact and the ribs 108 has to cause a risk of breakage thereof.

Accordingly, it is an object of the present invention to solve the above-mentioned problems in the prior art by providing an IC socket in which a lower side or a lateral side of the partition wall of the cover member is coupled to the rib to increase the mechanical strength of the cover member itself and to prevent the partition wall from breaking, resulting in the improvement of the degree of accuracy.

SUMMARY OF THE INVENTION

In order to achieve the above object, an IC socket of the present invention comprises a socket body for mounting an IC package thereon, a plurality of contacts provided in the socket body, and a cover member of a frame shape having an opening at a center thereof and adapted to be movable upward and downward, wherein a rib is provided to be coupled to either a lower surface or a lateral surface of a partition wall for sectioning a cam surface of the cover member for operating the contact. Thereby, since the partition wall is coupled to the rib, not only the partition wall but also the cover member itself are strengthened to prevent the partition wall from breaking and improve the accuracy.

According to the IC socket of the present invention, since the rib is coupled to the lower surface of the partition wall, it is possible to increase the mechanical strength of the cover member by such simple means and prevent the partition wall from breaking.

Also, according to the IC socket of the present invention, since the rib is coupled to the lateral surface of the partition wall, it is possible to increase the mechanical strength of the cover member by such simple means and prevent the partition wall from breaking.

Further, according to the IC socket of the present invention, since the contact has a movable contact section capable to deform elastically and extending from a portion fixed to the socket body, the contact can be made preferable, and the operation of the movable contact section becomes reliable to facilitate the mounting and removal of the IC package.

Furthermore, according to the IC socket of the present invention, since the contact is of a one-point touch structure having the movable contact section, comprising a movable contact point formed at a tip end of a bending portion bending at a generally right angle from a strip portion of the movable contact section capable to deform elastically and extending upward from a base section fixed to the socket body, and a follower portion extending upward from the bending portion, wherein a tip end of the follower portion is formed to be engaged with the cam surface on the lower side of the cover member and cam-operative thereby. Thereby, the contact can be made preferable, and the operation of the movable contact section becomes reliable to facilitate and smooth the mounting and removal of the IC package.

According to the IC socket of the present invention, since the contact has a stationary contact section and a movable contact section provided in correspondence to the stationary contact section to be movable relative thereto, thereby the external contact of the IC package is held preferable to contact the stationary contact section and the movable contact section of the contact, and the IC socket adapted to operate reliable each of the contacts can be manufactured particular.

Further, according to the IC socket of the present invention, the contact forms a two-point touch structure having the stationary contact section and the movable contact section, the stationary contact section and the movable contact section are branched from a base section fixed to the socket body, the movable contact section has a movable contact point formed at a tip end of a bending portion extending from a strip portion of the movable contact section capable to deform elastically and extending upward from the base section, which bending portion bends to form a generally right angle relative to the strip portion, and a follower portion projected upward from the bending portion, and a tip end of the follower portion is engaged with a cam surface on the lower side of the cover member to be cam-operated. Thereby, the operation of the movable contact section becomes reliable to facilitate the mounting and removal of the IC package.

Also, according to the IC socket of the present invention, since the follower portion of the movable contact section is accommodated in a chamber defined by the cam surface on the lower side of the cover member and the partition walls coupled to the ribs, the operation of the movable contact section becomes reliable to facilitate the manufacture of the IC socket.

Furthermore, according to the IC socket of the present invention, since the follower portions of the movable contact sections are respectively arranged in the chambers on the lower side of the cover member, the contacts are effectively operable without being interfered with each other.

The above and other objects, effects, features and advantages of the present invention will become more apparent from the following description of embodiments thereof taken in conjunction with the accompanying drawings.

DETAILED DESCRIPTION OF PREFERRED EMBODIMENTS (First Embodiment)

Figure 1:
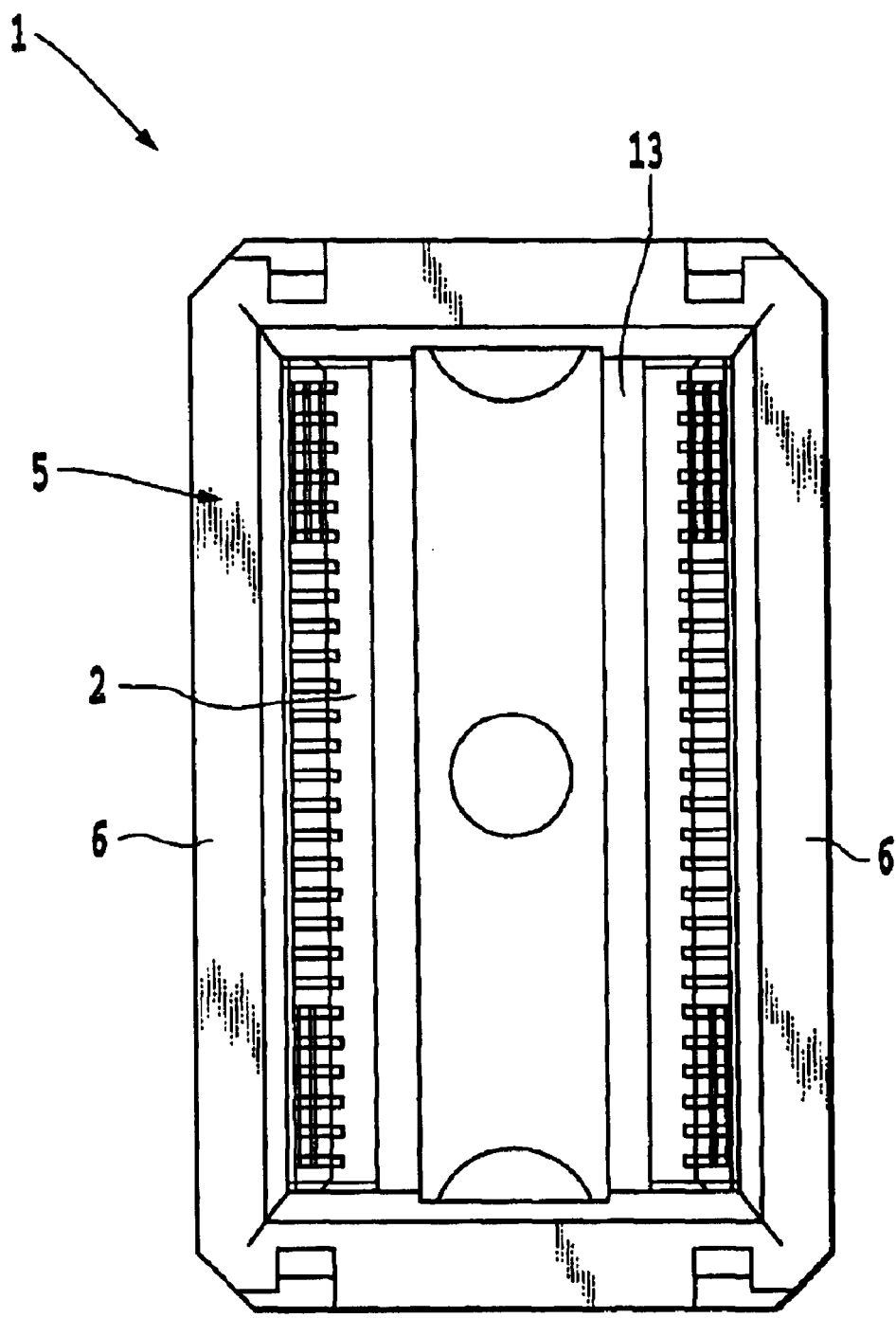
FIG. 1 is a plan view of an IC socket according to a first embodiment of the present invention.
Figure 2:
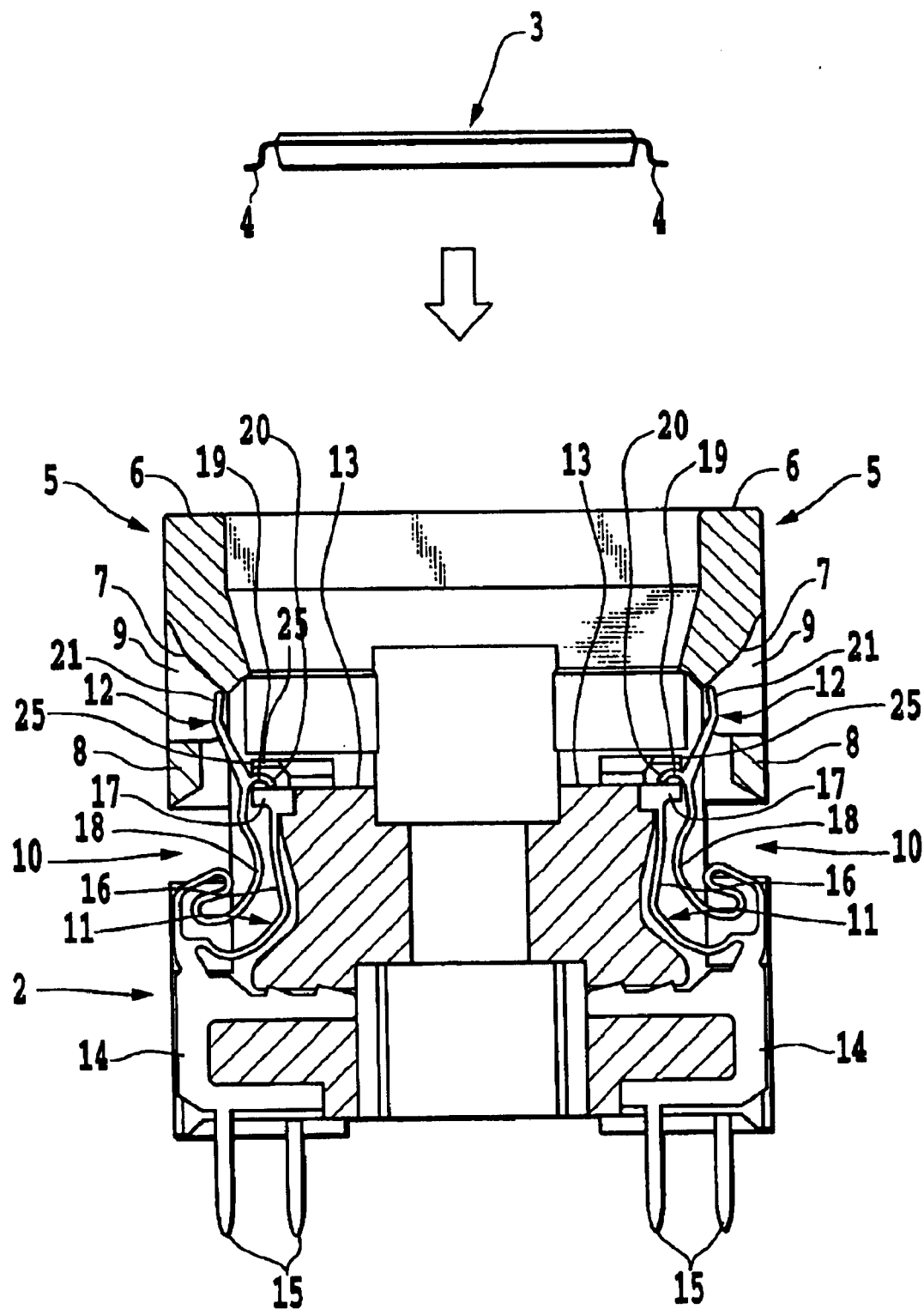
FIG. 2 is a vertical sectional view of the IC socket according to the present invention shown in FIG. 1 when an IC package is mounted thereto.
Figure 3:
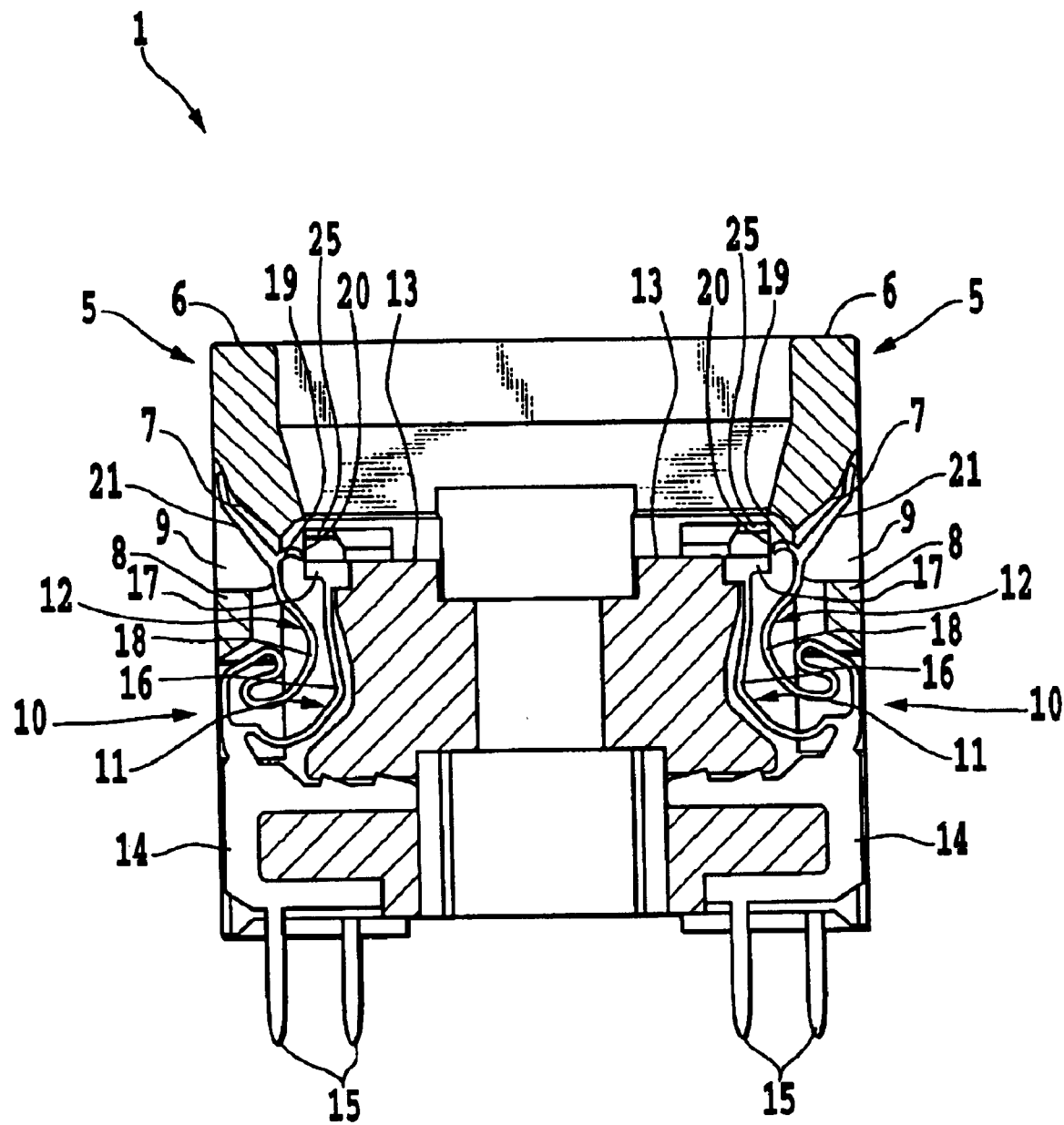
FIG. 3 is a vertical sectional view of the IC socket according to the present invention shown in FIG. 2 when a cover member is pressed to open a movable contact section.
Figure 4:
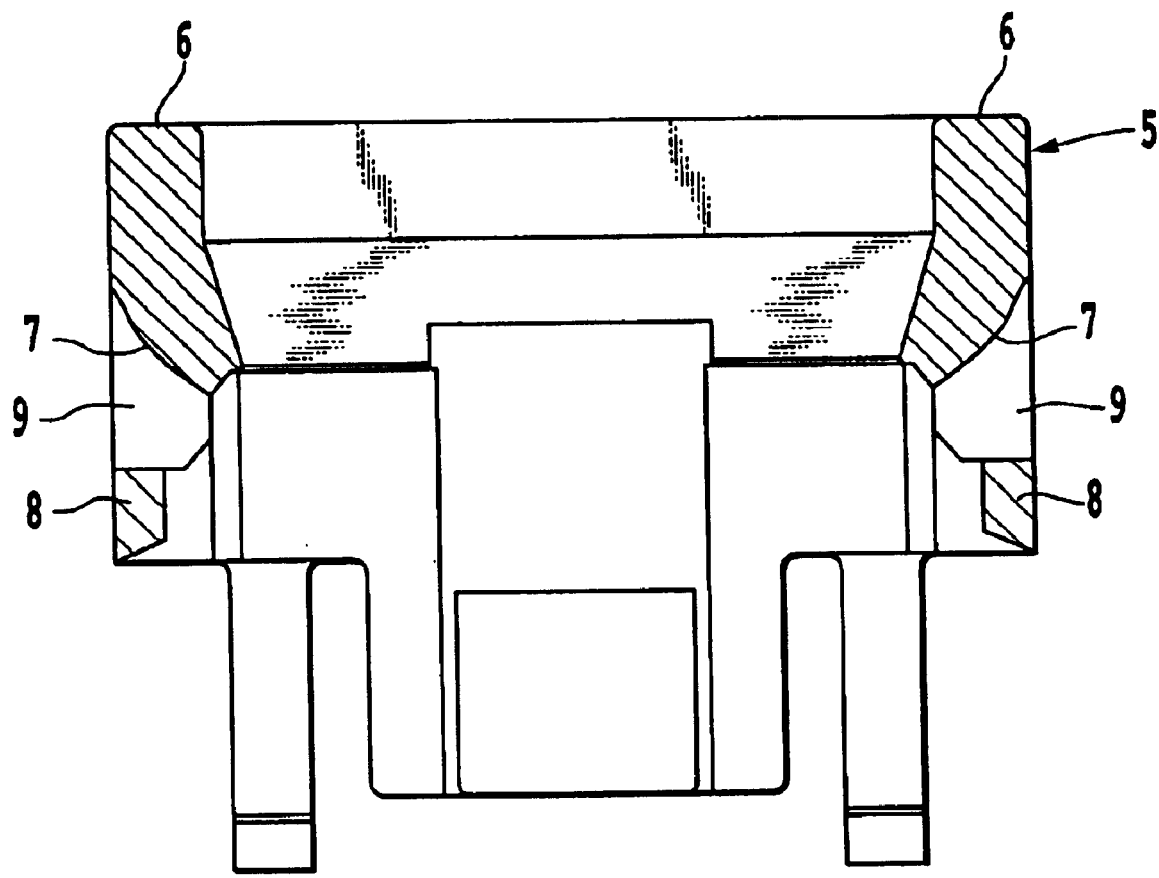
FIG. 4 is a vertical sectional view of a cover member of the IC socket according to the present invention shown in FIGS. 1 and 2.

FIGS. 1 to 4 schematically illustrate a first embodiment of an IC socket according to the present invention for explaining the same, in which FIG. 1 is a plan view of the IC socket; FIG. 2 is a vertical sectional view of the IC socket in FIG. 1 taken along a center line thereof; FIG. 3 is a vertical sectional view when a movable contact section shown in FIG. 2 opens; and FIG. 4 is a vertical sectional view of a cover member.

In this regard, while the IC package used as one embodiment of the present invention is a rectangular type IC part having a number of external contacts projecting outward from opposite lateral sides thereof, it is noted that the present invention should not be limited to such a rectangular type IC package but may be applied to other types of IC packages, such as a so-called dual flat lead type or a quad flat lead type.

As shown in FIGS. 1 to 4, the IC socket 1 in the present invention has a socket body 2 for mounting an IC package 3 having a number of external contacts 4 on opposite lateral sides thereof, a frame-shaped cover member 5 adapted to be movable upward and downward relative to the socket body 2, and a plurality of contacts 10 of a two-point touch structure provided in the socket body 2.

The contact 10 forms a two-point touch structure having a stationary contact section 11 fixed to the socket body 2 and a movable contact section 12 to be movable in correspondence to the stationary contact section 11. Also, the contact 10 has a lying U-shaped base section 14 attached to the socket body 2 and provided with a terminal section 15 projected downward from the base section 14 to be inserted into a testing device or other suitable instrument. In this regard, the respective terminal section 15 is positioned to alternately deviate outward or inward from the adjacent one so that the mechanical strength of a portion of the socket body 2 to which the contact is attached becomes sufficient and the connection of the contacts with the socket of the mated device into which the terminal section 15 are inserted is further improved.

The IC socket 1 in the present invention is of a rectangular shape in this embodiment as shown in FIG. 1, which is a so-called dual flat lead type having a number of external contacts 4 arranged along opposite longer lateral sides. However, the IC socket should not be limited to a rectangular shape as illustrated, but may be of a square shape. Also, the external contacts 4 should not be limited to the illustrated arrangement projected from the opposite lateral sides only, but may be of a quad flat lead type.

The socket body 2 is provided with a placement section 13 for positioning an IC package 3 or others to be placed thereon in a central region, and is provided with positioning members 25 such as corner members at required positions of the placement section 13 engaged with four corners of the IC package 3 and guiding them for mounting the IC package 3. Furthermore, a number of contacts are attached in parallel on the opposite sides thereof.

The cover member 5 is of a frame shape having an opening at a center thereof, and forms a flat pressing section 6 on the outer periphery of the upper side and a cam surface 7 and partition walls 9 on the lower side thereof. Therefore, a chamber, that is, a space for the movable contact section 12 of the respective contact 10 is defined between every adjacent partition walls 9. Further, the cover member 5 is provided with ribs 8 below the partition walls 9. Since the rib 8 is coupled to be integrated with the lower surface of the partition wall 9, the mechanical strength of the partition wall 9 is furthermore increased to prevent the same from breaking.

Like this, a chamber for accommodating a follower portion 21 of the movable contact section 12 of the contact 10 is formed in a lower portion of the opposite longer sides of the pressing section 6, and the partition wall 9 is provided between every adjacent chamber to individually accommodate the movable contact section 12. Accordingly, when the cover member 5 is pressed, a tip end of the follower portion 21 of the movable contact section 12 is pushed out downward so that the movable contact section 12 is bent and deformed. Thereby, a contact point 20 is apart from a contact point 17 of the stationary contact section 11 to free the external contact 4 of the IC package 3 therefrom, whereby it is possible to take the IC package 3 out from the socket by a robot or a hand, and if necessary, to exchange an old IC package from a fresh one.

As shown in FIGS. 2 and 3, the contact 10 is of a two-point touch structure forming of the stationary section 11 and the movable contact section 12 provided in correspondence to this stationary contact section 11, and is fixed to the socket body 2 in the lying U-shaped base section 14, from which are branched the stationary contact section 11 and the movable contact section 12. Further, the terminal section 15 is projected downward from the base section 14 to be connected to a connection terminal of other suitable device.

The stationary contact section 11 of the contact 10 has a standing-up portion 16 extending upward while curving from the base section 14 fixed to the socket body 2, and a contact point 17 formed at an upper end of the standing-up portion 16 to be brought into contact with the external contact 4 of the IC package 3 and hold the external contact 4 from below. The contact point 17 is also used as positioning means.

On the other hand, the movable contact section 12 has a strip portion 18 extending upward from the base section 14 while curving in a generally S-shape, a bending portion 19 bending from the strip portion 18 to form a generally right angle, a contact point 20 formed at a tip end of the bending portion 19 in correspondence to the stationary contact section 11 to be brought into contact with the external contact 4 of the IC package 3 from above, and a follower portion 21 extending upward from the bending portion 19, so that it is capable to deform elastically in the generally S-shaped strip portion 18.

The follower portion 21 extending upward from the bending portion 19 of the movable contact section 12 is brought into contact with the cam surface 7 on the lower side of the cover member 5 as illustrated, and operated by the cam surface 7 of the cover member 5 when the cover member 5 is pushed down, so that the tip end of the follower portion 21 is pushed obliquely downward to bend the movable contact section 12 outward. By this outward deformation of the movable contact section 12, the contact point 20 of the movable contact section 12 is away from the external contact 5 of the IC package 3 placed on the contact point 17 of the stationary contact section 11, and as shown in FIG. 3, both the contact points 17 and 20 are apart from each other.

Since the contact point 17 of the movable contact section 12 is away from the external contact 4 of the IC package 3 to free the IC package 3 by pushing the cover member 5 downward, it is possible to remove the IC package 3 from the IC socket by a robot or a hand.

As described above, in the IC socket according to the first embodiment of the present invention, since the rib 8 is coupled to the lower surface of the partition wall 9, it is possible to increase the mechanical strength of the cover member 5 by such simple means and effectively prevent the partition wall 9 from breaking.

(Second Embodiment)

Figure 5:
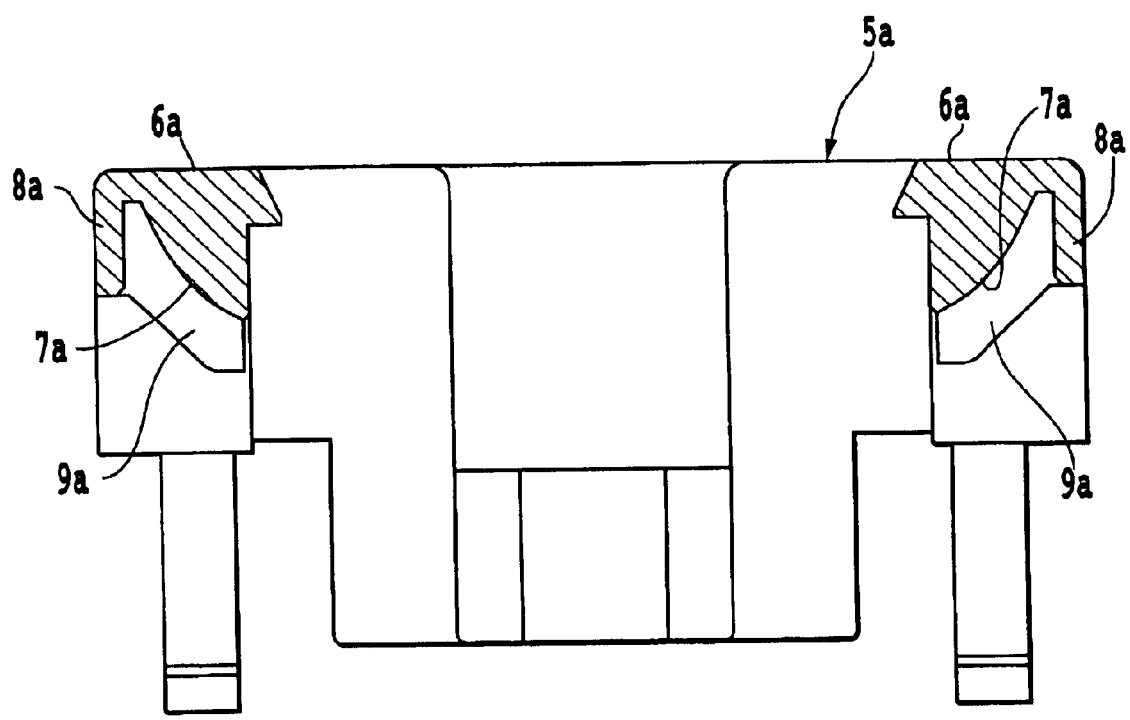
FIG. 5 is a vertical sectional view of a cover member of an IC socket according to a second embodiment of the present invention.

FIG. 5 is a vertical sectional view of an IC socket in a second embodiment according to the present invention, taken along a center line.

As illustrated, in the IC socket of the second embodiment to which is applied the present invention, a cover member 5a is of a frame shape having an opening at a center thereof in the same manner as in the preceding embodiment. This cover member 5a has a flat pressing section 6a on the outer periphery of the upper side and a cam surface 7a and partition walls 9a on the lower side thereof. Therefore, a chamber, that is, a space for the movable contact section of the respective contact is defined between every adjacent partition walls 9a. Further, the cover member 5a is provided with ribs 8a on the lateral side; i.e., on the outside of the partition walls 9a. Since the rib 8a is coupled to be integrally with the lateral surface of the partition wall 9a, the mechanical strength of the partition wall 9 is furthermore increased to prevent the same from breaking.

Accordingly, since the cover member 5a is manufactured by coupling the rib 8a to be integral with the lateral surface of the partition wall 9a, the mechanical strength of the cover member 5a itself is increased to further prevent the partition wall 9a from breaking.

The difference of the IC socket according to the second embodiment from that of the first embodiment is that the rib 8a is coupled to the lateral surface of the partition wall 9a from outside. It is possible to increase the mechanical strength of the cover member 5 by such simple means and effectively prevent the partition wall 9a from breaking.

(Third Embodiment)

Figure 6:
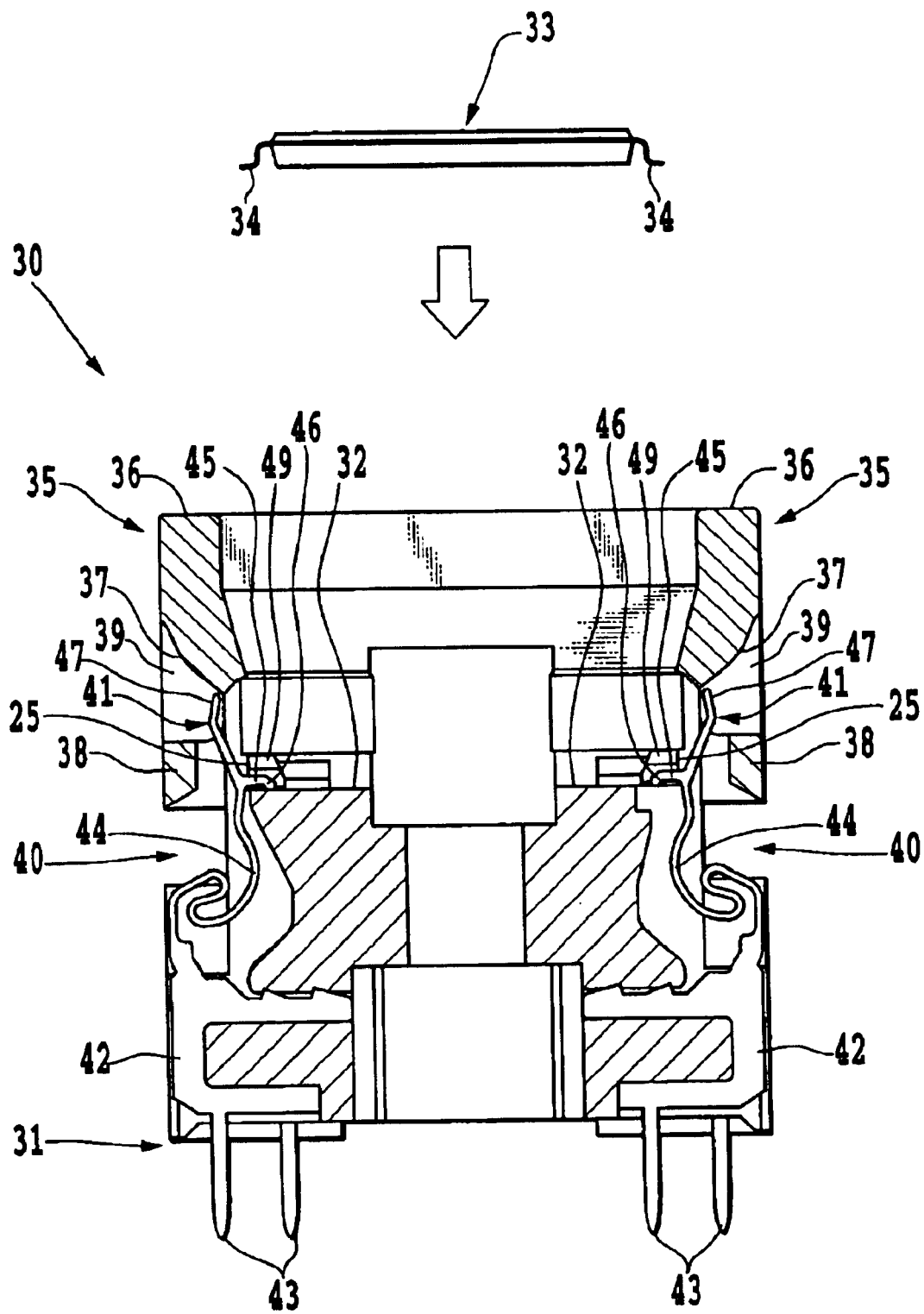
FIG. 6 is a vertical sectional view of an IC socket according to a third embodiment of the present invention when an IC package is mounted thereto.

FIG. 6 is a vertical sectional view of the IC socket illustrating a third embodiment of an IC socket according to the present invention.

In this regard, the IC socket has substantially the same basic structure as that of the preceding first embodiment, and the sole difference from the latter is that the contact is of a one-point touch structure, not the two-point touch structure.

Also, while the IC package used in this embodiment is a rectangular type IC part having a number of external contacts projecting outward from opposite lateral sides thereof, it is noted that the present invention should not be limited to such a rectangular type IC package but may be, of course, applied to other types of IC packages, such as a dual flat lead type or a quad flat lead type.

As shown in FIG. 6, the IC socket 30 in the present invention has a socket body 31 for mounting an IC package 33 having a number of external contacts 34 on opposite lateral sides thereof, a frame-shaped cover member 35 adapted to be movable upward and downward relative to the socket body 31, and a plurality of contacts 40 of a one-point touch structure provided symmetrically in the socket body 31.

The contact 40 forms a one-point touch structure having a movable contact section 41 to be movable relative to the socket body 31. Also, the contact 40 has a lying U-shaped base section 44 attached to the socket body 31 and provided with a terminal section 45 projected downward from the base section 44 to be inserted into a testing device or other suitable instrument.

The IC socket 30 in the present invention is of a rectangular shape in this embodiment as illustrated, and the used IC package 33 is a so-called dual flat lead type having a number of external contacts 34 arranged along opposite longer lateral sides. However, the IC package should not be limited to a rectangular shape as illustrated, but may be, of course, of a quad flat lead type.

In this embodiment, the socket body 31 is provided with a placement section 43 for positioning an IC package 33 or others to be placed thereon in a central region, and positioning members 49 such as corner members at required positions for engaging with four corners of the IC package 33 and guiding the same. Further, a number of contacts 40 are attached in parallel on the opposite sides thereof.

The cover member 35 is of a frame shape having an opening at a center thereof, and forms a flat pressing section 36 on the outer periphery of the upper side and a cam surface 37 and partition walls 39 on the lower side thereof. Therefore, a chamber, that is, a space for the movable contact section 41 of the respective contact 40 is defined between every adjacent partition walls 39. Further, the cover member 35 is provided with ribs 38 below the partition walls 39. Since the rib 38 is coupled to be integral with the lower surface of the partition wall 39, the mechanical strength of the partition wall 39 is furthermore increased to prevent the same from breaking.

Like this, a chamber for accommodating a follower portion 41 of the movable contact section 41 of the contact 40 is formed in a lower portion of the opposite longer sides of the pressing section 36 of the cover member 35, and the partition wall 39 is provided between every adjacent chamber to individually accommodate the movable contact section 41. Accordingly, when the cover member 35 is pressed, a tip end of the follower portion 47 of the movable contact section 41 is pushed downward toward outside by the cam surface 37 of the cover member 35 so that the movable contact section 41 is bent and deformed. Thereby, since a contact point 46 is apart from the placement section 32 when the IC package 33 is not mounted, it is possible to mount the IC package 33. On the other hand, if the IC package 33 is mounted, since the contact point 46 is away from the external contact 34 of the IC package 33 mounted on the placement section 32 in the socket body 31 and becomes free, it is possible to take the IC package 33 out from the socket body by a robot or hand and, if necessary, to change the same to a fresh IC package.

As shown in FIG. 6, the contact 40 is of a one-point touch structure consisting of the movable contact section 41 which is movable to the socket body 31.

That is, as illustrated, the contact 40 of this embodiment has a movable contact section 41 operated to be close and away relative to the external contact 34 of the IC package 33, a base section 42 of a lying U-shape for fixing the contact 40 to the socket body 31, and a terminal section 43 extending downward from one leg of the U-shape of the base section 42 in the generally vertical direction.

As described, the movable contact section 41 of the contact 40 has a strip portion 44 extending upward from the base section 42 while curving in a generally S-shape, a bending portion 45 bending from the upper part of the strip portion 44 and extending inward in the lateral direction to form a contact point 46 at a tip end thereof, and a follower portion 47 branched from the upper part of the strip portion 44 and extending upward.

Accordingly, the contact 40 is fixed to the socket body 31 via the base section 42, and the terminal section 43 extends from one leg of the base section 42 to be connected with connection terminals of other suitable devices.

The movable contact section 41 of the contact 40 has the strip portion 44 extending upward from the base section 42 fixed to the socket body 31 while bending in a generally S-shape capable to deform elastically, the bending portion 45 branched from the upper end of the strip portion 44 and extending inward, and the follower portion 47 extending upward, wherein the contact point 46 to be brought into contact with the external contact 35 of the IC package 33 placed on the placement section 32 is provided at a tip end of the bending portion 45.

The follower portion 47 extending upward from the strip portion 44 of the movable contact section 41 is brought into contact with the cam surface 37 on the lower side of the cover member 35 as illustrated, and operated by the cam surface 37 of the cover member 35 when the cover member 35 is pushed down. Thereby, a tip end of the follower portion 47 in the movable contact section 41 is pressed obliquely downward so that the elastically deformed strip portion 44 of a generally S-shape bends outward, whereby the contact point 46 of the movable contact section 41 is away from the external contact 34 of the IC package 33 placed on the placement section 32 in the socket body 31 due to this outward deformation of the movable contact section 41 to open the contact point 46.

Since the contact point 46 of the movable contact section 41 is away from the placement section 32 or the external contact 34 of the IC package 33 in such a manner to free the IC package 33 by pressing the cover member 35, it is possible to mount or remove the IC package 33 relative to the socket body by a robot or hand.

As described above, in the IC socket according to the third embodiment of the present invention, since the rib 38 is coupled to the lower side of the partition wall 39, it is possible to increase the mechanical strength of the cover member 35 by such simple means and effectively prevent the partition wall 39 from breaking.

(Fourth Embodiment)

Figure 7:
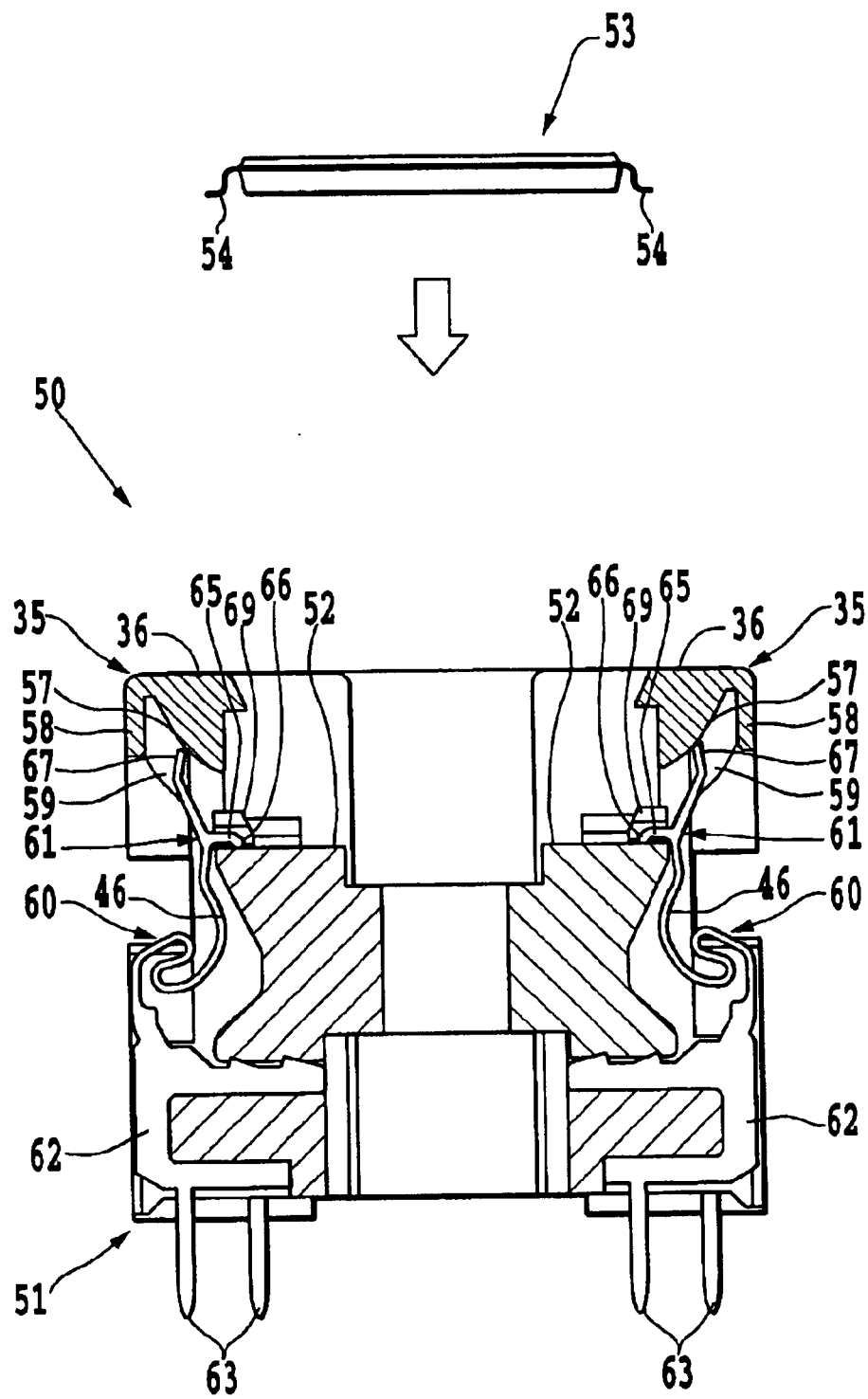
FIG. 7 is a vertical sectional view of an IC socket according to a fourth embodiment of the present invention when an IC package is mounted thereto.
Figure 8:
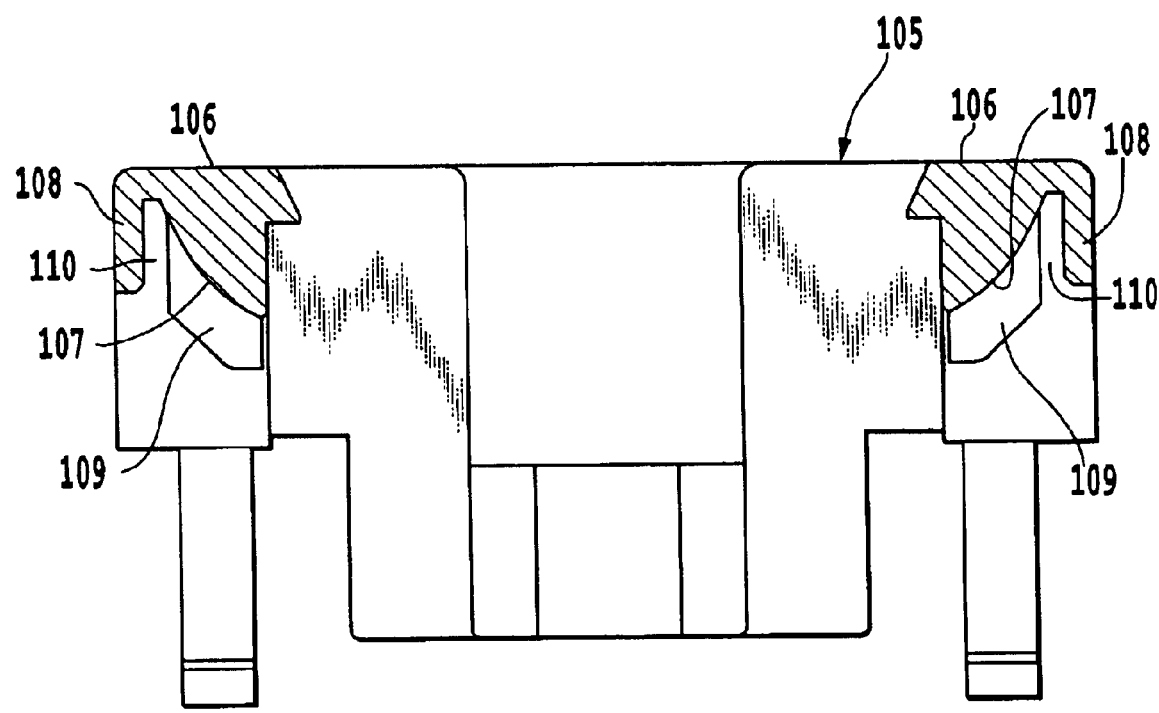
FIG. 8 is a vertical sectional view of a cover member of a conventional IC socket.

FIG. 7 is a vertical sectional view of an IC socket in a fourth embodiment according to the present invention, taken along a center line.

In this regard, the IC socket in this embodiment has substantially the same basic structure as that of the preceding first to third embodiments, and the sole difference from the latter is that the contact is of a one-point touch structure, not the two-point touch structure in the first and second embodiments, and the structure of the cover member is generally equal to that of the second embodiment shown in FIG. 5.

Also, while the IC package used in this embodiment is a rectangular type IC part having a number of external contacts projecting outward from opposite lateral sides thereof, it is noted that the present invention should not be limited to such a rectangular type IC package but may be, of course, applied to other types of IC packages, such as a dual flat lead type or a quad flat lead type.

As shown in FIG. 7, the IC socket 50 in the present invention has a socket body 51 for mounting an IC package 53 having a number of external contacts 60 on opposite lateral sides thereof, a frame-shaped cover member 55 adapted to be movable upward and downward relative to the socket body 51, and a plurality of contacts 60 of a one-point touch structure provided symmetrically in the socket body 51.

The contact 60 forms a one-point touch structure having a movable contact section 61 to be movable relative to the socket body 51. Also, the contact 60 has a lying U-shaped base section 54 attached to the socket body 51 and provided with a terminal section 55 projected downward from the base section 54 to be inserted into a testing device or other suitable instrument.

The IC socket 60 in the present invention is of a rectangular shape in this embodiment as illustrated, which is a so-called dual flat lead type having a number of external contacts 54 arranged along opposite longer lateral sides. However, the IC socket should not be limited to a rectangular shape as illustrated, but may be, of course, of a quad flat lead type.

In this embodiment, the socket body 51 is provided with a placement section 52 for positioning an IC package 53 or others to be placed thereon in a central region, and positioning members 69 such as corner members at required positions for engaging with four corners of the IC package 53 and guiding the same. Further, a number of contacts 60 are attached in parallel on the opposite sides thereof.

A cover member 55 is of a frame shape having an opening at a center thereof and has a flat pressing section 56 on the outer periphery of the upper side and a cam surface 57 and partition walls 59 on the lower side thereof. Therefore, a chamber, that is, a space for the movable contact section 51 of the respective contact 60 is defined between every adjacent partition walls 59. Further, the cover member 55 is provided with ribs 58 on the lateral side; i.e., on the outside of the partition walls 59. Since the rib 58 is coupled to be integral with the lateral surface of the partition wall 59, the mechanical strength of the partition wall 59 is furthermore increased to prevent the same from breaking.

In such a manner, the cover member 55 has, in a lower part of the opposite longer sides of the pressing section 56, a chamber for accommodating the follower portion 67 of the movable contact section 61 in the contact 60, and the partition wall 59 is provided between every adjacent chambers for individually accommodating the movable contact section 61. Accordingly, when the cover member 55 is pressed, a tip end of the follower portion 67 of the movable contact section 61 is pushed out downward toward outside by the cam surface 57 on the underside of the cover member 55 so that the movable contact section 61 is bent and deformed. Thereby, since a contact point 66 is apart from the placement section 52 when the IC package 53 is not mounted, it is possible to mount the IC package 53. On the other hand, if the IC package 53 is mounted, since the contact point 66 is away from the external contact 54 of the IC package 53 mounted on the placement section 52 and becomes free, it is possible to take the IC package 33 out from the socket body by a robot or hand and, if necessary, to change the same to a fresh IC package.

As shown in FIG. 7, the contact 60 is of a one-point touch structure consisting of the movable contact section 61 which is movable to the socket body 61 as same as the contact 40 in the preceding third embodiment.

That is, as illustrated, the contact 60 of this embodiment is formed as a one-point touch structure which has a movable contact section 61 operated to be close and away relative to the external contact 54 of the IC package 53, a base section 62 of a lying U-shape for fixing the contact 60 to the socket body 51, and a terminal section 63 extending downward from one leg of the U-shape of the base section 62 in the generally vertical direction.

Like this, the movable contact section 61 of the contact 60 has the strip portion 64 extending upward from the base section 62 while bending in a generally S-shape, the bending portion 65 branched from the upper part of the strip portion 64 and extending inward in the lateral direction to form the contact point 66 at a tip end thereof, and the follower portion 67 branched from the strip portion 64 and extending upward.

Thus, the contact 60 is fixed to the socket body 51 on the base section 62, and the terminal section 63 extends from one leg of the base section 62 to be connected with connection terminals of other suitable devices.

Also, the movable contact section 61 of the contact 60 has the strip portion 64 capable to deform elastically and extending upward from the base section 62 fixed to the socket body 51 while bending in a generally S-shape, the bending portion 65 branched from the upper end of the strip portion 64 and extending inward, and the follower portion 67 branched from the strip portion 64 and extending upward, wherein the contact point 66 is provided at a tip end of the bending portion 65 and brought into contact with the external contact 54 of the IC package 53 placed on the placement section 52.

The follower portion 67 in the movable contact section 61 extending upward from the strip portion 64 is brought into contact with the cam surface 72 on the lower side of the cover member 55 as illustrated to be operated by the cam surface 57 of the cover member 55 so that the elastically deformed strip portion 64 of a generally S-shape bends outward when the cover member 55 is pushed downward, which outward deformation of the movable contact section 61 causes the contact point 66 of the movable contact section 61 to be apart from the external contact 54 of the IC package 53 placed on the placement section 52 of the socket body 51.

Since the contact point 66 of the movable contact section 61 is away from the placement section 52 of the socket body 51 or the external contact 54 of the IC package 53 by pushing the cover member 55 downward to free the IC package 53, it is possible to mount the IC package 33 or remove the same from the socket body by a robot or hand.

Like this, in the IC socket 50 according to the fourth embodiment of the present invention, since the rib 58 is coupled to the outside of the partition walls 59, it is possible to increase the mechanical strength of the cover member 55 by such simple means and effectively prevent the partition wall 59 from breaking.

As described above, the IC socket of the present invention has a socket body for mounting an IC package thereon, a plurality of contacts provided in the socket body, and a cover member of a frame shape having an opening at its center and movable upward and downward, since a rib is provided either on the lower surface or the lateral surface of a partition wall for sectioning a cam surface of the cover member for operating the movable contact section, not only the partition wall but also the cover member itself are strengthened to prevent the partition wall from breaking and improve the accuracy. Also, according to the IC socket of the present invention, the rib is coupled to the lower surface of the partition wall, it is possible to increase the mechanical strength of the cover member by such simple means and prevent the partition wall from breaking. Further, according to the IC socket of the present invention, the rib is coupled to the lateral surface of the partition wall, it is possible to increase the mechanical strength of the cover member by such simple means and prevent the partition wall from breaking.

Further, according to the IC socket of the present invention, the contact has the movable contact section elastically deformable and extending from the base section fixed to the socket body, and the contact forms a one-point touch structure having only the movable contact section or a two-point touch structure having the stationary contact section and the movable contact section. In the contact of the one-point touch structure, since the movable contact section is elastically deformable, the contact can be made easily and can be operated securely and then the IC package can be mounted and removed reliably and smoothly. Furthermore, according to the IC socket of the present invention, in the contact of the two-point touch structure the stationary contact section and the movable contact section are branched from a base section fixed to the socket body, the movable contact section has a movable contact point formed at a tip end of a bending portion extending from an elastically deformable strip portion of the movable contact section extending upward from the base section, which bending portion bends to form a generally right angle relative to the strip portion, and a follower portion projected upward from the bending portion, and a tip end of the follower portion is engaged with a cam surface on the lower side of the cover member to be cam-operated. Thereby, the operation of the movable contact section becomes reliable to facilitate the mounting and removal of the IC package. Also, since the follower portion of the movable contact section is accommodated in a chamber defined by the cam surface on the lower side of the cover member and the partition walls coupled to the ribs, the operation of the movable contact section becomes reliable to facilitate the manufacture of the IC socket. Also, according to the IC socket of the present invention, since the follower portions of the movable contact sections are respectively arranged in the chambers on the lower side of the cover member, the contacts are effectively operable without being interfered with each other.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. An IC socket having a socket body for mounting an IC package, the IC socket comprising;

a plurality of contacts provided in the socket body; and a cover member movable in an upward direction and a downward direction, having a cam surface, a plurality of partition walls, and a plurality of ribs;

wherein the cam surface is provided on a lower surface of the cover member to engage the plurality of contacts;

wherein the partition walls are disposed on the cam surface and define adjacent accommodating portions for the plurality of contacts; and wherein each rib is disposed between partition walls and is coupled to be integrated to at least one of a lower surface and a lateral surface associated with each partition wall to increase a mechanical strength of each partition wall.

2. An IC socket as claimed in claim 1, wherein the rib is coupled to the lower surface of the partition wall.

3. An IC socket as claimed in claim 1, wherein the rib is coupled to the lateral surface of the partition wall.

4. An IC socket as claimed in claim 1, wherein the contact has a movable contact section capable to deform elastically and extending from a portion fixed to the socket body.

5. An IC socket as claimed in claim 4, wherein the contact is of a one-point touch structure having the movable contact section, comprising a movable contact point formed at a tip end of a bending portion bending at a generally right angle from a strip portion of the movable contact section capable to deform elastically and extending upward from a base section fixed to the socket body, and a follower portion extending upward from the bending portion, wherein a tip end of the follower portion is formed to be engaged with the cam surface on the lower side of the cover member and is cam-operated thereby.

6. An IC socket as claimed in claim 1, wherein the contact has a stationary contact section and a movable contact section provided in correspondence to the stationary contact section to be movable relative thereto.

7. An IC socket as claimed in claim 4, wherein the contact forms a two-point touch structure having the stationary contact section and the movable contact section, the stationary contact section and the movable contact section are branched from a base section fixed to the socket body, the movable contact section has a movable contact point formed at a tip end of a bending portion extending from a strip portion of the movable contact section capable to deform elastically and extending upward from the base section, which bending portion bends to form a generally right angle relative to the strip portion, and a follower portion projected upward from the bending portion, and a tip end of the follower portion is engaged with a cam surface on the lower side of the cover member to be cam-operated.

8. An IC socket as claimed in claim 5, wherein the follower portion of the movable contact section is accommodated in a chamber defined by the cam surface on the lower side of the cover member and the partition walls coupled to the ribs.

9. An IC socket as claimed in claim 4, wherein the follower portions of the movable contact sections are respectively arranged in the chambers on the lower side of the cover member.

* * * * *